United States Patent
Jeong et al.

(10) Patent No.: US 7,725,801 B2
(45) Date of Patent: May 25, 2010

(54) METHOD OF GENERATING QUASI-CYCLIC LOW DENSITY PARITY CHECK CODES AND AN APPARATUS THEREOF

(75) Inventors: Hong-Sil Jeong, Seoul (KR); Se-Ho Myung, Pohang-si (KR); Kyeong-Cheol Yang, Pohang-si (KR); Hyun-Gu Yang, Pohang-si (KR); Dong-Seek Park, Yongin-si (KR); Chi-Woo Lim, Suwon-si (KR); Jae-Yeol Kim, Suwon-si (KR); Seung-Hoon Choi, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 999 days.

(21) Appl. No.: 11/478,831

(22) Filed: Jun. 30, 2006

(65) Prior Publication Data

US 2007/0033483 A1    Feb. 8, 2007

(30) Foreign Application Priority Data

Jul. 1, 2005    (KR) ...................... 10-2005-0059169

(51) Int. Cl.
*H03M 13/00*    (2006.01)

(52) U.S. Cl. ...................... 714/755; 714/786; 714/762; 714/788

(58) Field of Classification Search ................. 714/755, 714/786, 762, 788
See application file for complete search history.

(56) References Cited

U.S. PATENT DOCUMENTS

| | | | |
|---|---|---|---|
| 2005/0050435 A1* | 3/2005 | Kyung et al. | ................. 714/800 |
| 2005/0149845 A1 | 7/2005 | Shin et al. | |
| 2008/0016433 A1* | 1/2008 | Stolpman | ..................... 714/786 |

FOREIGN PATENT DOCUMENTS

| | | |
|---|---|---|
| KR | 1020050021108 | 3/2005 |
| KR | 1020050044963 | 5/2005 |

* cited by examiner

*Primary Examiner*—Guy J Lamarre
(74) *Attorney, Agent, or Firm*—The Farrell Law Firm, LLP (57) ABSTRACT

Disclosed is a method and apparatus for completely recovering received data with high reliability using LDPC codes without short-sized cycles in a digital communication system using an error-correcting code. The method includes performing exponent conversion of a predetermined number of exponent matrixes stored in advance in a memory so as to generate new exponent matrixes based on the exponent conversion, and generating new LDPC codes using the new exponent matrixes.

39 Claims, 7 Drawing Sheets

$$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}$$

| $P^a{}_{11}$ | $P^a{}_{12}$ | $P^a{}_{13}$ | $P^a{}_{14}$ | ... | $P^a{}_{1(n-1)}$ | $P^a{}_{1n}$ |
|---|---|---|---|---|---|---|
| $P^a{}_{21}$ | $P^a{}_{22}$ | $P^a{}_{23}$ | $P^a{}_{24}$ | ... | $P^a{}_{2(n-1)}$ | $P^a{}_{2n}$ |
| $P^a{}_{31}$ | $P^a{}_{32}$ | $P^a{}_{33}$ | $P^a{}_{34}$ | ... | $P^a{}_{3(n-1)}$ | $P^a{}_{3n}$ |
| ⋮ | ⋮ | ⋮ | ⋮ | ... | ⋮ | ⋮ |
| $P^a{}_{m1}$ | $P^a{}_{m2}$ | $P^a{}_{m3}$ | $P^a{}_{m4}$ | ... | $P^a{}_{m(n-1)}$ | $P^a{}_{mn}$ |

FIG.3

(PRIOR ART)

METHOD OF GENERATING QUASI-CYCLIC LOW DENSITY PARITY CHECK CODES AND AN APPARATUS THEREOF

PRIORITY

This application claims priority under 35 U.S.C. §119 to an application entitled "Method of Generating Quasi-Cyclic Low Density Parity Check Codes and An Apparatus Therefor" filed in the Korean Intellectual Property Office on Jul. 1, 2005 and assigned Serial No. 2005-59169, the contents of which are incorporated herein by reference.

BACKGROUND OF THE INVENTION

1. Field of the Invention

The present invention relates to a digital communication system using error-correcting codes, and more particularly a method of transmitting and receiving data using quasi-cyclic low density parity check codes and an apparatus therefor.

2. Description of the Related Art

Generally speaking, a digital communication system provides effective and reliable transmission of data through a channel. The next generation multimedia mobile communication system being recently and vigorously developed demands the capabilities of treating and transmitting varieties of information such as video data and text data together with voice communication at high speeds. Accordingly, to meet such demand, it is essential to improve the efficiency of the system by applying a suitable channel coding technique thereto.

Meanwhile, the wireless channel environment for the digital communication system inherently causes multi-path interference, shadowing, wave damping, noises, fading, etc., which is different from the wireless environment, resulting in information loss that distorts the transmitted signals. In order to cope with such information loss various error-control techniques adapted for the channel characteristics in the communication system have been proposed. Among them one of the most basic techniques is to use the error-correcting code.

The next generation communication system has been developed to provide communication services for transmitting a large amount of data at high speed with various QoS (Quality of Service). Hence, the error-correcting capability of the error-correcting code critically determines the QoS of the entire data service to prevent information loss. Typical examples of an error-correcting code include turbo code, low density parity check (LDPC) code, etc.

The LDPC code has been known to have good performance gain in data transmission at high speed compared to the conventional convolution code which is chiefly used for correction of errors. It is advantageous in effectively correcting the errors caused by noises occurring in the wireless channel to enhance the reliability of data transmission. The LDPC code also has an advantage in that it may perform decoding by using an iterative decoding algorithm based on the sum-product algorithm using a factor graph. The decoder of the LDPC code has lower complexity than that of the turbo code, and better feasibility in designing a parallel processing decoder.

The turbo code has good performance approaching the channel capacity limit of Shannon's Channel Coding Theorem while the LDPC code shows performance with a deviation of about 0.04 dB from the channel capacity limit of Shannon's Channel Coding Theorem at a BER (Bit Error Rate) of $10^{-5}$ using a block size of $10^7$. Shannon's Channel Coding Theorem represents the possibility of reliable communication with a data rate not exceeding the channel capacity. However, Shannon did not show how to perform coding and decoding practically in order to not exceed the channel capacity limit. Though a random code with a considerably large block size shows performance approximating the channel capacity limit of Shannon's Channel Coding Theorem, the MAP (Maximum A posteriori) or ML (Maximum Likelihood) decoding thereof is practically impossible due to the huge load resulting from the very large amount of required calculation.

Meanwhile, there exist cycles in the factor graph describing the LDPC code, where iterative decoding has been known to be suboptimal. Nevertheless, it has been experimentally discovered that the LDPC code shows good performance through iterative decoding. But if the number of the cycles having a shorter length is increased, degradation of performance may be expected, and a lot of effort has been made to design an LDPC code having no shorter cycle. For example, the LDPC code proposed by Gallagher is defined by a parity check matrix, of which a large number of elements have the value of 0 (null) and the remaining very small number the value of 1. Namely, the parity check matrix of the LDPC code has a very small weight, so that even a relatively long block code may be decoded through iterative decoding. Further, by continuously increasing the length of the block code, the LDPC code shows performance closely approaching the channel capacity limit of Shannon. Hence, the LDPC code tends to be positively used as the error-correction code in the next generation communication system.

Meanwhile, the LDPC code (N, j, k) is a linear block code with a block size N, having a parity check matrix of a sparse structure that consists of a number j of is per each column, a number k of is per each row, and the remaining elements of 0. Such a parity check matrix with a constant column weight j and a constant row weight k is called a regular LDPC code. On the contrary, the parity check matrix with non-constant column and row weights is called an irregular LDPC code. In this case, the term "weight" means the number of the elements with a non-zero value. Generally the irregular LDPC code has been known to have better performance as compared to the regular LDPC code. However, in order to obtain an irregular LDPC code with good performance, it should be suitably selected the number of 1s per row and per column.

Figure 1:
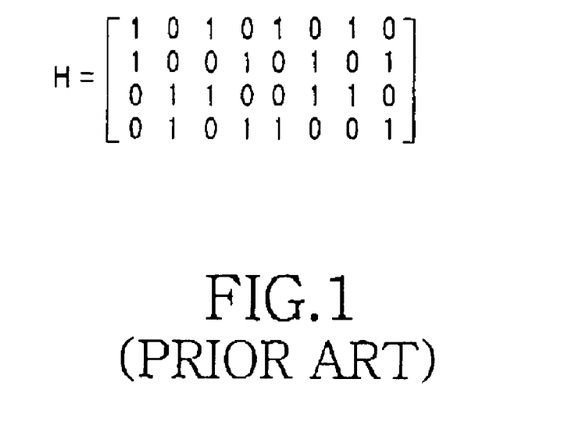
FIG. 1 illustrates the parity check matrix of a conventional (8, 2, 4) LDPC code.
Figure 2:
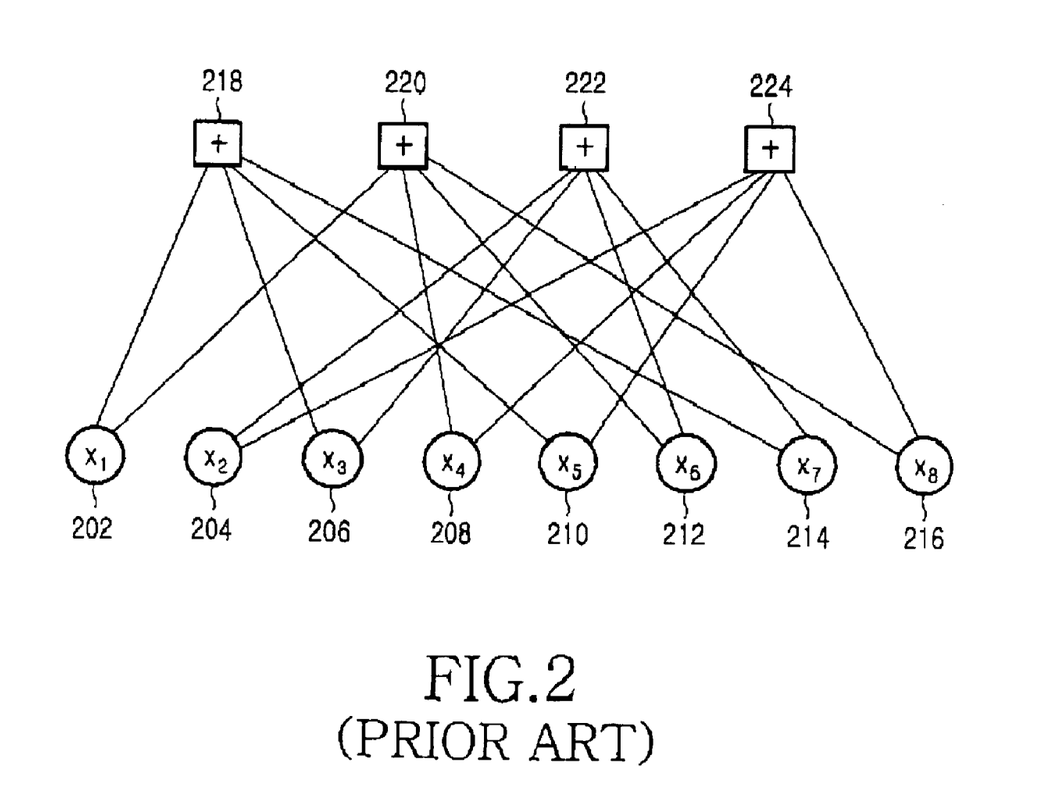
FIG. 2 is a factor graph of a conventional (8, 2, 4) LDPC code.

Referring to FIGS. 1 and 2, a parity check matrix (N=8, j=2, k=4) of the LDPC code is described. FIG. 1 shows the parity check matrix H, and FIG. 2 shows the factor graph of the parity check matrix. The parity check matrix H (8, 2, 4) of the LDPC code consists of 8 columns respectively having the same weight of two is and 4 rows respectively having the same weight of four 1s, as shown in FIG. 1.

FIG. 2 shows the factor graph of the parity check matrix (8, 2, 4) of the LDPC code, consisting of eight variable nodes 202, 204, 206, 208, 210, 212, 214 and 216, and four check nodes 218, 220, 222 and 224. The variable nodes 202, 204, 206, 208, 210, 212, 214 and 216 are represented by $x_1$, $x_2, \ldots, x_8$, and if there exists 1 at the point crossed by the ith column and jth row, a branch is formed between the variable node $x_i$ and the jth check node. Thus the parity check matrix of the LDPC code has a very small number of weight 1s, so that the LDPC code may be decoded through iterative decoding even with a large block size, and with the block size being continuously increased the LDPC code begins to have performance closely approaching the channel capacity limit of Shannon as the turbo code. Mackay and Neal already verified that the LDPC code begins to have performance closely approaching that of the turbo code through iterative decoding.

Additionally, the requirements for achieving an LDPC code having good performance are as follows:

The first requirement is to make the cycle larger. The term "cycle" means a closed path that does not pass over any node twice or more in the factor graph model of the LDPC code. Namely, the greater the number of the cycles of small size, the more the LDPC code suffers performance degradation, such as an error floor. Accordingly, the longer the cycle of the LDPC code produced in the factor graph, the better the LDPC code becomes with respect to performance.

The second requirement is to consider the distribution of degrees of the LDPC code in the factor graph. Generally the reason that the irregular LDPC code has better performance than the regular LDPC code is that the nodes of the irregular LDPC code have various degrees. The term "degree" represents the number of the edges connected with the variable nodes and check nodes in the factor graph of the LDPC code. In addition, the term "distribution of degrees" represents what percentage the nodes with a particular degree occupy of the entire nodes. According to Richardson, it is well-known that the LDPC code must have a particular distribution of degree for good performance.

As described above, the LDPC code is generally expressed using the parity check matrix. Hence, the memory size may be reduced by effectively storing the information of the parity check matrix. The conventional storing of the LDPC code requires a comparatively large memory. In order to cope with this, various methods for effectively storing the LDPC code have been proposed. For example, since Fan proposed the array code with a structural parity check matrix, various quasi-cyclic LDPC (hereinafter referred to as "QC-LDPC") codes have been developed based on the circulant permutation matrix in order to improve the memory efficiency. The QC-LDPC code is composed of a number of small blocks obtained by dividing the parity check matrix each matched with a circulant permutation matrix or a zero matrix. The QC-LDPC code is described below in connection with FIG. 3.

Figure 3:
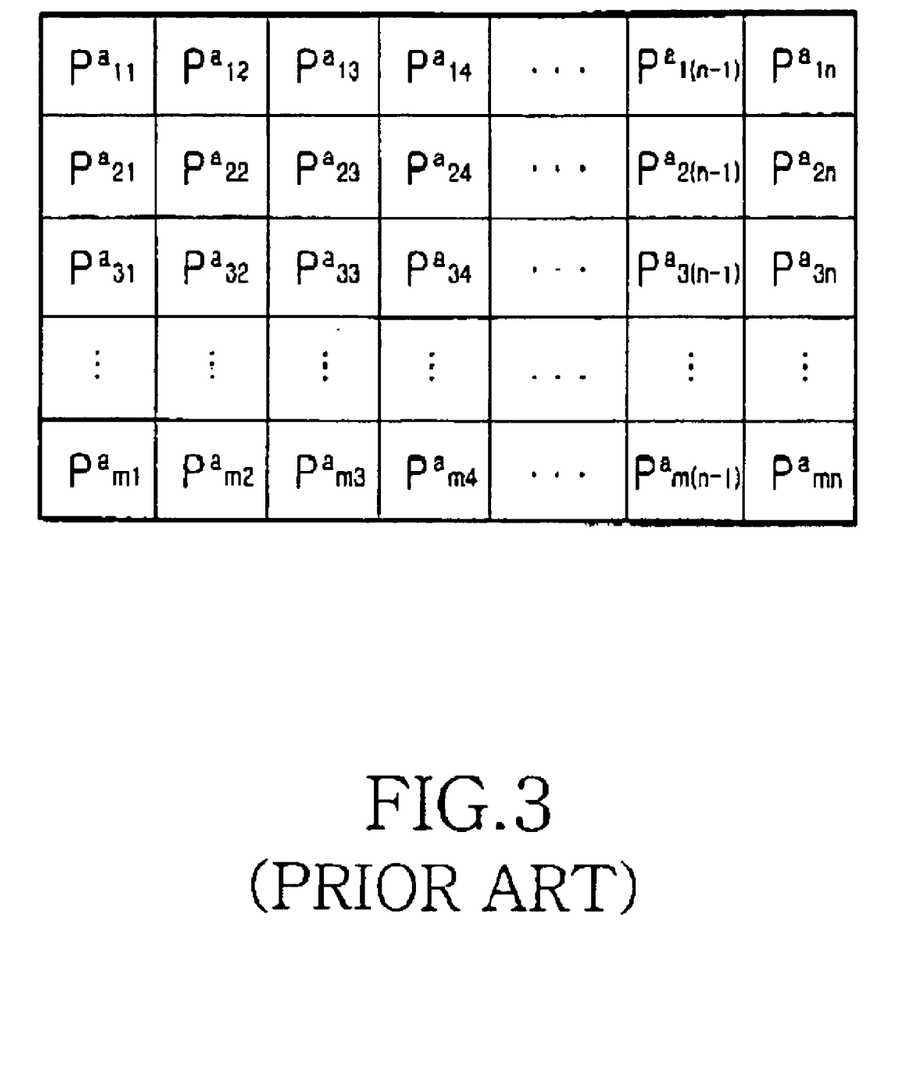
FIG. 3 is a diagram illustrating the parity check matrix of a conventional QC-LDPC code.

FIG. 3 is a diagram illustrating the parity check matrix of the QC-LDPC code. The QC-LDPC code is a new LDPC code for improving the storage and performance of the effective parity check matrix. The parity check matrix of the QC-LDPC code is formed by dividing the entire parity check matrix into a plurality of partial blocks each matched with a permutation matrix. In FIG. 3, the reference symbol P represents a permutation matrix with a size of $N_s \times N_s$ as expressed by the following Formula 1, and its superscript $a_{mn}$ is in the range $0 \leq a_{mn} \leq N_s -1$ or limitless ($a_{mn} - \infty$), wherein "m" and "n" represent the permutation matrix of a partial block positioned at the cross point of the m'th row and the n'th column of the entire partial blocks. Namely, "m" and "n" respectively represent the row and column locating the partial block containing an information part in the parity check matrix. Formula 1 represents an example of the permutation matrix as shown in FIG. 3.

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix} \quad \text{Formula 1}$$

As expressed by Formula 1, the permutation matrix P is a square matrix with a size of $N_s \times N_s$, wherein each of the $N_s$ rows has a weight of 1, and each of the $N_s$ columns a weight of 1. Hereinafter the size $N_s \times N_s$ is shortened as $N_s$ for convenience's sake because the permutation matrix P is square. In addition, if the superscript $a_{mn}$–0, the permutation matrix $P^0$ means the unit matrix $1_{N_s \times N_s}$ and if $a_{mn}-\infty$, $P^{a_{mn}}$ is the zero matrix O.

In the mean time, a small cycle in the LDPC code causes performance degradation. Namely, a small cycle causes the information from a node to return to itself even after a small number of repetitions, so that the same information continuously returning to it prevents an information revision resulting in degradation of the error-correction capability. Hence, the LDPC code having good performance may be obtained by increasing the size of the cycle and decreasing the number of small cycles.

Figure 4:
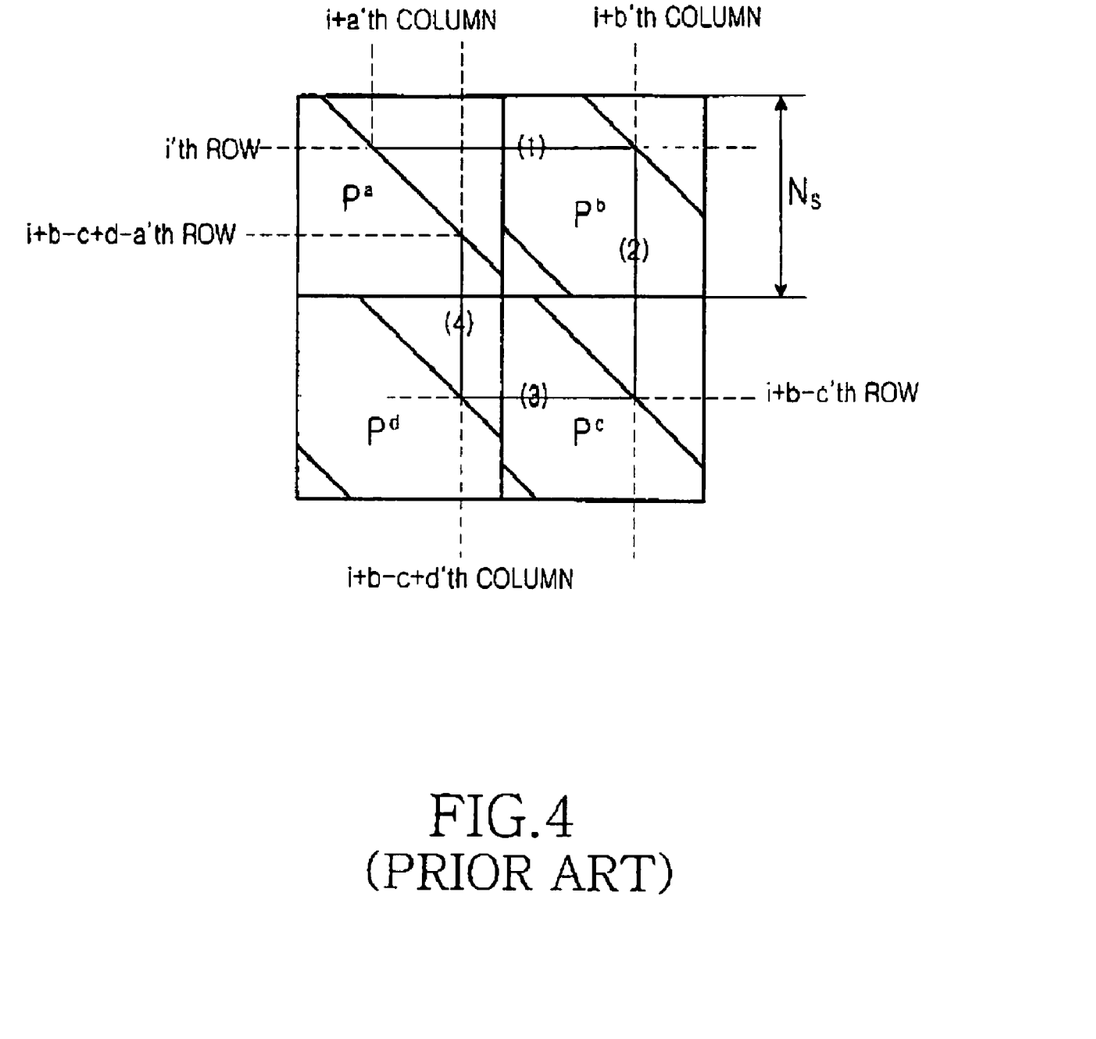
FIG. 4 is a block diagram illustrating the structural characteristics of the cycle of a conventional QC-LDPC code.

FIG. 4 is a diagram illustrating the structural characteristics of the cycle of the QC-LDPC code. As described above, the QC-LDPC code is an LDPC code extended by generalizing the structure of the regular LDPC code in order to achieve effective coding and improve the storage and the performance of the effective parity check matrix.

Referring to FIG. 4, the structural characteristics of the cycle of the QC-LDPC code are analyzed with the parity check matrix consisting of four blocks. In the drawing the diagonal lines indicate the position of 1, and the remaining parts all indicate the position of 0. The symbol P represents the permutation matrix as shown in FIG. 3. Hereinafter the permutation matrixes corresponding to the partial blocks are referred to as "partial matrixes."

For analyzing the structure of the cycle of the QC-LDPC code, 1 positioned in the ith row of the partial matrix $P^a$ is determined as the reference point defined as "0-Point." In this case, the 0-Point is positioned in the i+ath column of the partial matrix $P^a$. And 1 of the partial matrix $P^b$ positioned in the same row as the 0-Point is defined as "1-Point." In this case, the 1-Point is positioned in the i+bth column of the partial matrix $P^b$.

Then, 1 of the partial matrix $P^c$ positioned in the same column as the 1-Point is defined as "2-Point." Since the partial matrix $P^c$ is obtained by displacing each column of the unit matrix I toward the right by the amount of "c" with reference to modulo $N_s$, the 2-Point is positioned in the i+b−cth row of the partial matrix $P^c$. And 1 of the partial matrix $P^d$ positioned in the same row as the 2-Point is defined as "3-Point." Then likewise, the 3-Point is positioned in the i+b−c+dth column of the partial matrix $P^d$.

Finally, 1 of the partial matrix, $P^a$ positioned in the same column as the 3-Point is defined as "4-Point." The 4-Point is positioned in the i+b−c+d−a th row of the partial matrix $P^a$. In this case, if there exists the cycle with a size of 4 in the parity check matrix of QC-LDPC code shown in FIG. 4, the 0-Point and the 4-Point occupy the same position. Namely, the relationship between the 0-Point and the 4-Point is expressed by the following Formula 3.

$$i \equiv i+b-c+d-a \pmod{Ns} \text{ or}$$

$$i+a \equiv i+b-c+d \pmod{Ns} \quad \text{Formula 3}$$

Formula 3 can be rewritten as in the following Formula 4.

$$a+c \equiv b+d \pmod{Ns} \quad \text{Formula 4}$$

Thus, if the relationship is expressed by Formula 4, there is produced a cycle with a size of 4.

Generally if the 0-Point and the 4m-Point become to equal each other for the first time, their relationship is expressed by the following Formula 5, which may be rewritten as in Formula 6.

$$i \equiv i+m(b-c+d-a) \pmod{Ns} \quad \text{Formula 5}$$

$$m(a-b+c-d) \equiv 0 \pmod{Ns} \quad \text{Formula 6}$$

Namely, if the least positive integer satisfying Formula 6 for the values of a, b, c and d given is "m", the cycle with 4m size becomes the cycle with the minimum size in the parity check matrix of the QC-LDPC code as shown in FIG. 4. Thus, if $\gcd(N_s, a-b+c-d)-1$ for $(a-b+c-d) \neq 0, m-N_s$, and therefore the cycle with a size of $4N_s$ is the cycle with the minimum size.

Generally, the irregular LDPC code requires the position information for each weight of the parity check matrix to be stored. On the contrary, the QC-LDPC code requires only the position of the first weight of the small block to be stored because the position of the first weight determines automatically the positions of the remaining $N_s-1$ weights in the block. Accordingly, if $N_s$ is known, the exponent of the size m×n is only stored in order to store the information of the parity check matrix H defined as in FIG. 3. Hence, the QC-LDPC code requires the memory capacity approximately proportional to $1/N_s$ compared with the conventional irregular LDPC code. Meanwhile, different QC-LDPC codes require different memories for storing the parity check matrixes, so that the memory capacity must be increased for storing the parity check matrixes of several QC-LDPC codes.

Conventionally, the QC-LDPC codes of short size are stored in a memory different from one for those of long size, or the QC-LDPC codes of long size are subjected to the modulo operation so as to produce those of short size. However, if the exponent matrix is subjected to an arbitrary modulo operation, the cycle characteristics in the Tanner graph of the QC-LDPC code are significantly changed, resulting in performance degradation. In this case, if the modulo operation is performed so as to not degrade the cycle characteristics in order to avoid performance degradation, the number of the codes to be produced is greatly limited. Therefore, there has been requested a solution for generating a plurality of the QC-LDPC codes with good cycle characteristics.

SUMMARY OF THE INVENTION

It is an object of the present invention to provide a method and apparatus for transmitting data without errors in a digital communication system.

It is another object of the present invention to provide a method and apparatus for effectively exchanging data in a digital communication system using the LDPC code.

It is still another object of the present invention to provide a method and apparatus for completely recovering the received data with high reliability by using the LDPC codes without short-sized cycles in a digital communication system.

It is further another object of the present invention to provide a method and apparatus for designing the LDPC codes without short-sized cycles in a digital communication system.

It is a further object of the present invention to provide a method and apparatus for combining QC-LDPC codes so as to form the LDPC codes without short-sized cycles in a digital communication system.

It is still a further object of the present invention to provide a method and apparatus for storing a plurality of QC-LDPC codes by using a small amount of memory in a digital communication system.

According to an aspect of the present invention, a method of generating LDPC codes in a communication system using an error-correcting code, includes performing exponent conversion of a predetermined number of exponent matrixes stored in advance so as to generate new exponent matrixes based on the exponent conversion, and generating new LDPC codes by using the new exponent matrixes.

According another aspect of the present invention, a method of generating a QC-LDPC code in a communication system using an error-correcting code, includes calculating the size of the permutation matrixes constituting the generated parity check matrix corresponding to the exponent value of a given parity check matrix, calculating the exponent value of the parity check matrix based on the size calculated of the permutation matrixes, calculating the exponent matrix based on the exponent value, and exponent-coupling the exponent matrix and the permutation matrixes so as to generate the parity check matrix.

According to still another aspect of the present invention, an apparatus for generating QC-LDPC codes in a communication system using an error-correcting code, includes a first memory for storing the exponent matrixes of the QC-LDPC codes, an exponent converter for performing exponent conversion of a given number of exponent matrixes stored in the first memory so as to generate the exponent values of the generated parity check matrixes, a second memory for storing new exponent matrixes based on the exponent values outputted from the exponent converter, and a QC-LDPC code generator for generating new QC-LDPC codes based on the exponent matrixes stored in the second memory.

According to a further aspect of the present invention, an apparatus for generating QC-LDPC codes in a communication system using an error-correcting code, includes a variable node decoder for detecting the probabilities of received signals by connecting variable nodes corresponding to the weight of each of the columns constituting a determined parity check matrix, a de-interleaver for de-interleaving the output signal of the variable node decoder so as to correspond with the determined parity check matrix, a check node decoder for detecting the probabilities of the output signals of the de-interleaver by connecting check nodes corresponding to the weight of each of the rows constituting the determined parity check matrix, an interleaver for interleaving the output signal of the check node decoder so as to correspond with the determined parity check matrix, the output signal of the interleaver being delivered to the variable node decoder, a controller for controlling de-interleaving and interleaving so as to correspond with the determined parity check matrix, and a parity check matrix generator for generating the parity check matrix of the presently used block size based on the parity check matrix stored in a memory.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Preferred embodiments of the present invention will be described herein below with reference to the accompanying drawings. In the drawings, the same or similar elements are denoted by the same reference numerals even though they are depicted in different drawings. In the following description, well-known functions or constructions are not described in detail since they would obscure the invention in unnecessary detail.

The present invention provides a digital communication system with a method of error-free exchanging data with high reliability and performance using a QC-LDPC code as an error-correcting code. In particular, the present invention reduces data exchanging errors by combining QC-LDPC codes of a short size so as to generate those of a large size. Also the girth of the QC-LDPC code of the long size obtained according to of the present invention is equal to or greater than that of the component QC-LDPC codes of short size. The term "girth" represents the least cycle.

For purpose of providing an effective description of the present invention, the QC-LDPC code having a matrix $H_k$ of $mL_k \times nL_l$ ($k=1,2,\ldots,s$) as the parity check matrix is defined as $c_k$. The exponent matrix and mother matrix for each k are respectively defined as $E(H_k)=(a_{mn}^k)$ and $M(H_k)$. The mother matrix $M(H_k)$ is the same for every k, and $\gcd(L_k,L_l)=1$ is assumed for l and k provided $l \neq k$.

Additionally defined are the following terms for convenience's sake:

1) Mother Matrix: m×n binary matrix M(H) may be uniquely obtained by substituting "0" and "1" respectively for the zero matrix (0) and permutation matrix (P) of the parity check matrix H of the QC-LDPC code. Namely, M(H) is the mother matrix of the parity check matrix H.

2) Exponent Matrix: the exponent matrix E(H) of the parity check matrix H is expressed by Formula 2.

$$E(H) = \begin{bmatrix} a_{11} & a_{12} & \cdots & a_{1(n-1)} & a_{1n} \\ \vdots & \vdots & \cdots & \vdots & \vdots \\ a_{m1} & a_{m2} & \cdots & a_{m(n-1)} & a_{mn} \end{bmatrix} \quad \text{Formula 2}$$

Wherein the exponent matrix E(H) has the same size as the mother matrix M(H).

3) Exponent Coupling: the parity check matrix H is obtained by coupling the exponent matrix E(H) and the permutation matrix P. For example, the parity check matrix may be expressed by $H=E(H) \cdot P$ that is called "exponent coupling."

4) Block Cycle: the cycle generated between 1s of the mother matrix M(H).

5) Exponent Chain: for the mother matrix M(H) with the block cycle of 2l may be expressed by the following exponent chain:

$$P^{a_1} \to \ldots \to P^{a_{2l}} \to P^{a_2} \text{ or } (a_1, \ldots, a_{2l}, a_1)$$

Hereinafter, using the above definitions, is described a method of designing the QC-LDPC code C with the parity check matrix H of mL×nL by applying the Chinese Remainder Theorem giving a common solution for simultaneous linear congruence equations.

Figure 5:
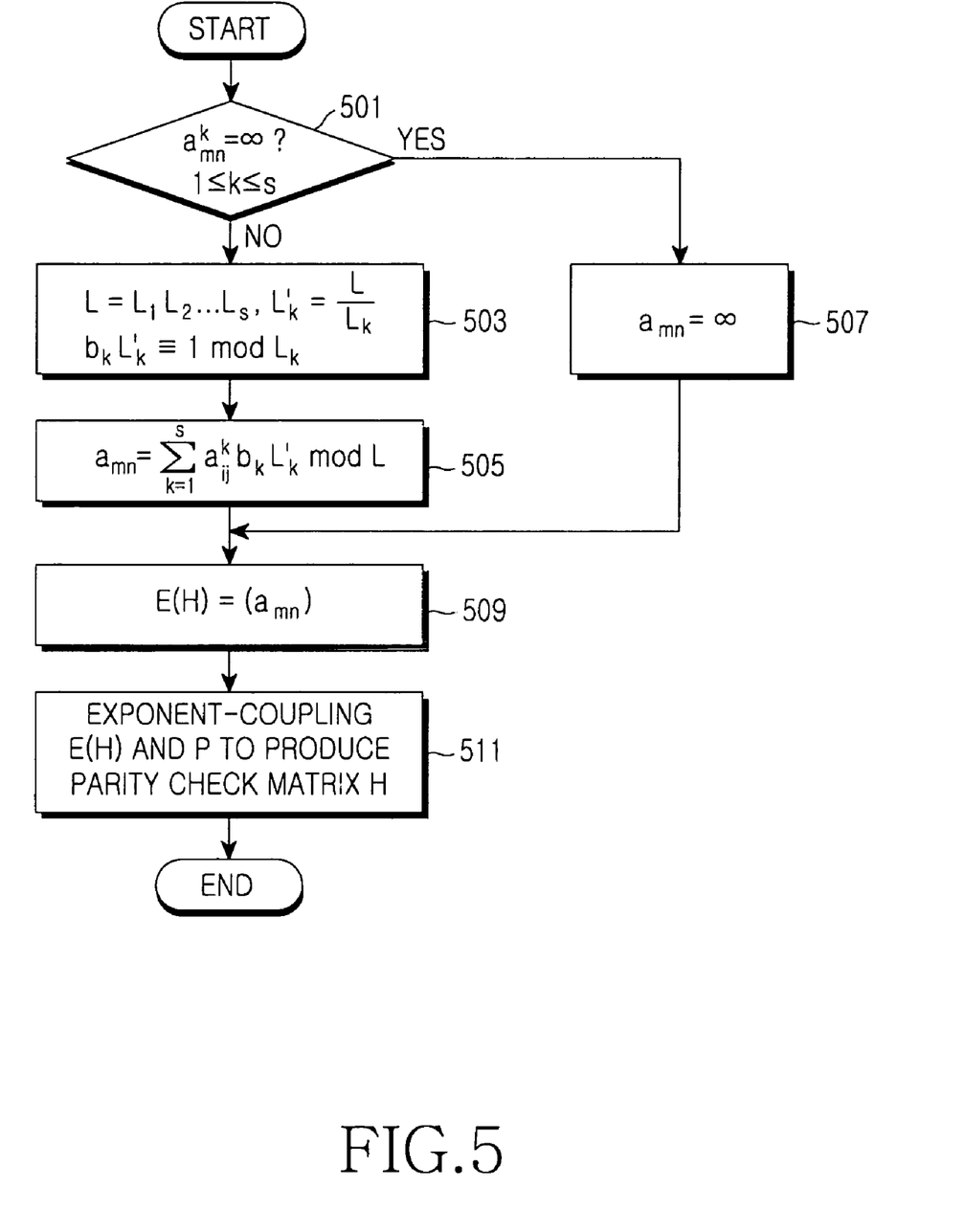
FIG. 5 is a flowchart illustrating a method of combining QC-LDPC codes to generate a new type of QC-LDPC code according to the present invention.

Referring to FIG. 5 for illustrating a process of combining the QC-LDPC codes of short size so as to generate the QC-LDPC codes of long size by applying Chinese Remainder Theorem, it is determined in step 501 whether the exponent value $a_{mn}^k$ of the k-numbered parity check matrix $H_k$ for $1 \leq k \leq s$ is infinity ($\infty$). If the exponent value $a_{mn}^k$ of the k-numbered parity check matrix $H_k$ is not infinity ($\infty$), the process proceeds to step 503. If it is infinity ($\infty$), the process proceeds to step 507.

In step 503, the size L of the permutation matrix P constituting the parity check matrix H is calculated, which is expressed by the following Formula 7.

$$L = L_1 L_2 \ldots L_s \quad \text{Formula 7}$$

Then after determining an arbitrary constant $b_k$ satisfying the following Formula 8 in step 503, the process goes to step 505.

$$b_k L'_k \equiv 1 \mod L_k, \quad \text{Formula 8}$$
$$L'_k = \frac{L}{L_k}$$

$b_k$ is a constant required for determining the exponent by applying Chinese Remainder Theorem, and secures the girth of the newly generated parity check matrix to be equal to or greater than that of the original parity check matrix.

Then in step 505 the exponent $a_{mn}$ of the parity check matrix H is calculated based on the size L of the permutation matrix P and constant $b_k$ obtained in step 503, and thereafter the process goes to step 509. The exponent $a_{mn}$ of the parity check matrix H is expressed by the following Formula 9.

$$a_{nm} = \sum_{k=1}^{s} a_{mn}^k b_k L'_k \mod L \quad \text{Formula 9}$$

L represents the block size of the parity check matrix newly obtained. The symbol $b_k$ is an arbitrary constant satisfying the above Formula 8. The symbol $L'_k$ is the value obtained by dividing the value L produced by multiplying all $L_k$ for every k from 1 to s by $L_k$. The present invention designs a longer parity check matrix based on the parity check matrixes numbering s or more. Hence, the symbol s means that there exist parity check matrixes numbering s or more, and the symbol k represents the index number ranging from 1 to s.

Alternatively, if the exponent value $a_{mn}^k$ of the k-numbered parity check matrix $H_k$ is infinity ($\infty$), namely, the m'th row and n'th column of the mother matrix M(H) are 0, step 507 sets the exponent value $a_{mn}$ expressed by Formula 9 of the parity check matrix H to infinity ($\infty$), and proceeds to step 509. In this case, the parity check matrix $M(H_k)$ with the range of $1 \leq k \leq s$ and the mother matrix M(H) are the same.

After calculating the exponent value $a_{mn}^k$ for every m and every n in steps 505 or 507, the process goes to step 509 to calculate the exponent matrix E(H), and then to step 511. The exponent matrix E(H) is defined by Formula 10.

$$E(H) = (a_{mn}) \quad \text{Formula 10}$$

Subsequently, the parity check matrix H is obtained in step 511 based on the exponent matrix E(H) obtained in step 509, namely, by exponent-coupling the exponent matrix E(H) and the permutation matrix P. Hereinafter is described the procedure for obtaining the parity check matrix H as mentioned above using examples.

To this end, the QC-LDPC code $C_1$ using the permutation matrix of $L_1 \times L_1$ size for $L_1$ and $L_2$ satisfying $\gcd(L_1,L_2)=1$ is defined as well as the QC-LDPC code $C_2$ using the permutation matrix of $L_2 \times L_2$ size, and a method of designing the QC-LDPC code using $L_1L_2 \times L_1L_2$ by exponent-coupling $C_1$ and $C_2$ is described.

First, the exponent matrix of the QC-LDPC code $C_1$ is defined as $E(H_1)=(a_{ij})$, and that of the QC-LDPC code $C_2$ as $E(H_2)=(b_{ij})$. And it is assumed that the mother matrixes of the two QC-LDPC codes $C_1$ and $C_2$ have a relationship of $M(H_1)=M(H_2)$. Then using Chinese Remainder Theorem, the element $c_{ij}$ of the exponent matrix $E(H)=(c_{ij})$ obtained by exponent-coupling the two codes $C_1$ and $C_2$ is calculated by the following Formula 11.

$$c_{ij} \equiv (a_{ij}A_1L_2 + b_{ij}A_2L_1) \bmod L_1L_2$$

Wherein the symbols $A_1$ and $A_2$ are the integers respectively satisfying $A_1L_2 \equiv 1 \bmod L_1$ and $A_2L_1 \equiv 1 \bmod L_2$.

Then the exponent matrix $E(H)$ and the permutation matrix P of $L_1L_2 \times L_1L_2$ size are exponent-coupled to generate the parity check matrix H of a new QC-LDPC code. In this case, the girth of the parity check matrix H is equal to or greater than those of $C_1$ and $C_2$. Namely, the method of combining the QC-LDPC codes using Chinese Remainder Theorem as mentioned above enables the design of the new QC-LDPC code equal to or greater than the girth of the component codes. This is more specifically described as follows:

First, it is assumed that the exponent chain relating to $2l$ block cycle is $P^{a_1} \rightarrow \ldots \rightarrow P^{a_{2l}} \rightarrow P^{a_1}$, and r is the least positive integer satisfying the following Formula 12.

$$r \sum_{i=1}^{2l} (-1)^{i-1} a_i \equiv 0 \bmod L \qquad \text{Formula 12}$$

The (QC-LDPC code with $2l$ block cycle for r contains $2lr$ cycle.

As described above, the mother matrixes $M(H_1)$, $M(H_2)$, $M(H)$ with their respective parity check matrixes are all the same, namely, $M(H_1)=M(H_2)=M(H)$, and therefore each parity check matrix contains the block cycle of the same size. In this case, the block cycle with $2l$ size may be represented by $(a_1, a_2, \ldots, a_{2l}, a_1)$, $(b_1, b_2, \ldots, b_{2l}, b_1)$, $(c_1, c_2, \ldots, c_{2l}, c_1)$.

Here assuming that each of $r_1$, $r_2$, r is the least integer satisfying the following Formula 13, the parity check matrixes $H_1, H_2, H$ with $2l$ block cycle respectively contain the cycles of $2lr_1$, $2lr_2$, $2lr$ with a relationship of $r=r_1r_2$.

$$r_1 \sum_{i=1}^{2l} (-1)^{i-1} a_i \equiv 0 \bmod L_1 \qquad \text{Formula 13}$$

$$r_2 \sum_{i=1}^{2l} (-1)^{i-1} b_i \equiv 0 \bmod L_2$$

$$r \sum_{i=1}^{2l} (-1)^{i-1} c_i \equiv 0 \bmod L_1L_2$$

Accordingly, if $H_1$ and $H_2$ contain their respective cycles $2lr_1$, $2lr_2$, combining the $H_1$ and $H_2$ based on the Chinese Remainder Theorem generates a new parity check matrix H with $2lr_1r_2$ cycle. Namely, the minimum cycle of H becomes equal to or greater than that of the $H_1$ and $H_2$.

In other words, applying the cyclic permutation matrix of $L \times L$ size to the new exponent matrix $E=(a_{mn})$ results in the QC-LDPC code C of $mL \times nL$ size. In this case, the QC-LDPC code C does not suffer significant degradation of performance because its cycle characteristics do not become worse than those of the codes $c_k$; in the Tanner graph. Also, if the exponent matrixes of the QC-LDPC codes numbering M are stored, by using an exponent converter as described hereinafter the total number $2^M - M - 1$ of new QC-LDPC codes may be obtained.

As described above, it is guaranteed that the minimum cycle of the code obtained by the Chinese Remainder Theorem is greater than the minimum cycle of the component code. This proves the inventive method is much simpler in guaranteeing the minimum cycle than the conventional method for designing a QC-LDPC code of long size by finding out each exponent value.

Figure 6:
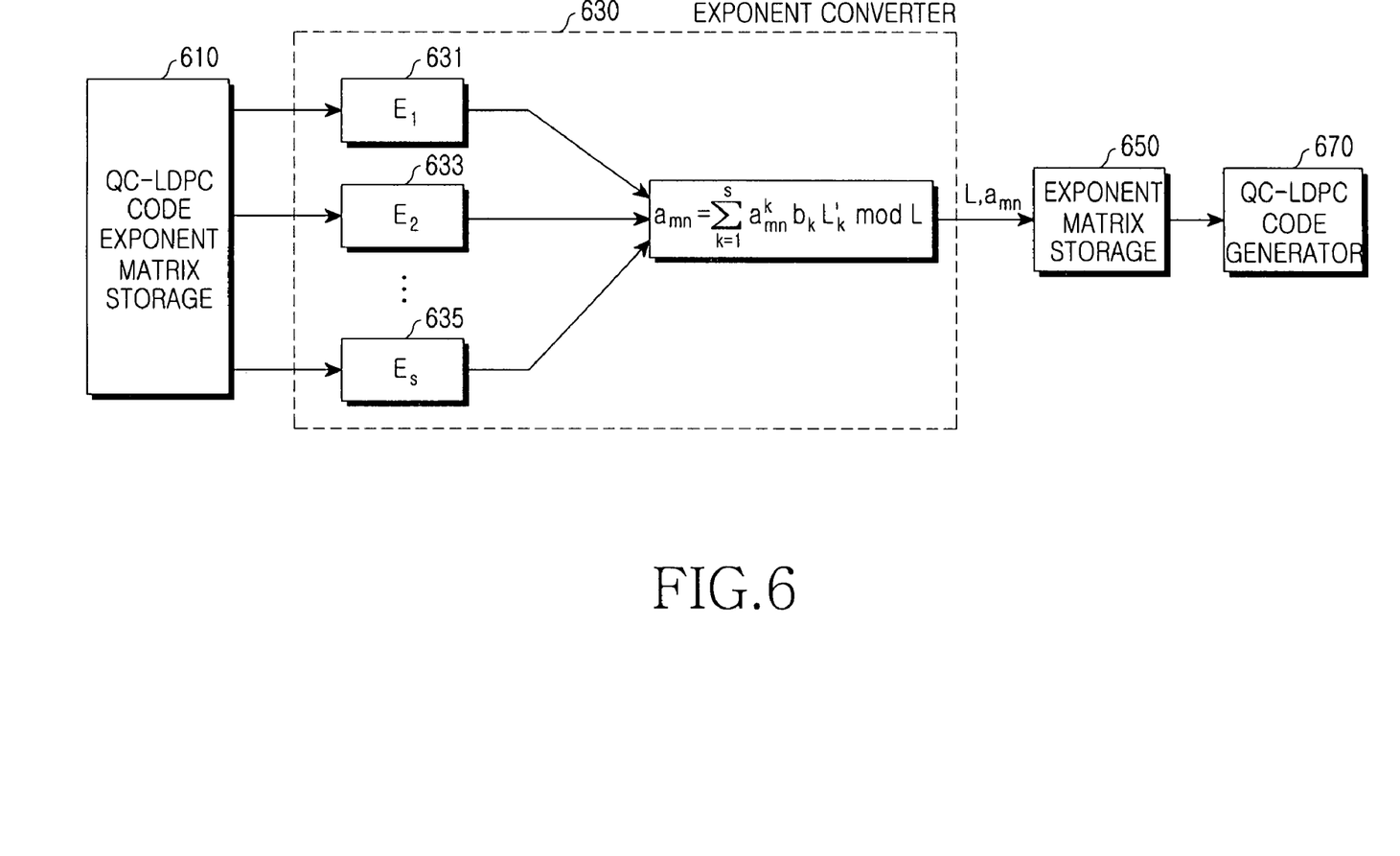
FIG. 6 is a block diagram illustrating an apparatus of combining QC-LDPC codes to generate a new type of QC-LDPC code according to the present invention.

FIG. 6 is a block diagram illustrating the construction of an apparatus for performing the inventive combining method as mentioned above. Before describing the inventive apparatus of FIG. 6, it will be noted that the QC-LDPC code composed of the cyclic permutation matrixes of $L_k \times L_k$ size for positive integers satisfying $1 \leq k \leq s$ ($k=1, 2, \ldots, s$) so as to have the parity check matrix $H_k$ of $mL_k \times nL_k$ size is defined as $C_k$ and the exponent matrix of each QC-LDPC code as $E(H_k)=(a_{mn}^k)$. Here, it is assumed that the positions of the elements of infinity ($\infty$), namely of the zero matrix blocks in each exponent matrix $E(H_k)$ are all the same, and $L_l$ and $L_k$ are co-primes for $l \neq k$. According to the present invention, the exponent matrixes of such QC-LDPC codes are stored in the memory. In this case, the element of infinity ($\infty$) may be stored using any method provided it is distinguished from other exponents.

Referring to FIG. 6, the inventive apparatus for generating a new QC-LDPC code applying the Chinese Remainder Theorem to component QC-LDPC codes includes QC-LDPC code exponent matrix storage 610, exponent converter 630, exponent matrix storage 650, and QC-LDPC generator 670.

It is assumed that the QC-LDPC code exponent matrix storage 610 stores the exponent matrix $E(H_k)$ of the k'th (k-numbered) QC-LDPC code $C_k$. The exponent converter 630 performs exponent conversion on the basis of the exponent matrixes numbering s or more stored in the QC-LDPC code exponent matrix storage 610 using Formula 9. Namely, the exponent converter 630 calculates the size L of each of the permutation matrixes constituting the s or more parity check matrixes H stored in the QC-LDPC code exponent matrix storage 610, and the exponent value $a_{mn}$ of the parity check matrix H for each of the s or more exponent matrixes $E_1(\textbf{631})$, $E_2(\textbf{633})$, $E_s(\textbf{635})$, and transfers the size L and the exponent value $a_{mn}$ to the exponent matrix storage 650.

Then the exponent matrix storage 650 stores new exponent matrixes based on the values received from the exponent converter 630. Finally the QC-LDPC generator 670 generates new QC-LDPC codes based on the exponent matrixes stored in the exponent matrix storage 650.

Figure 7:
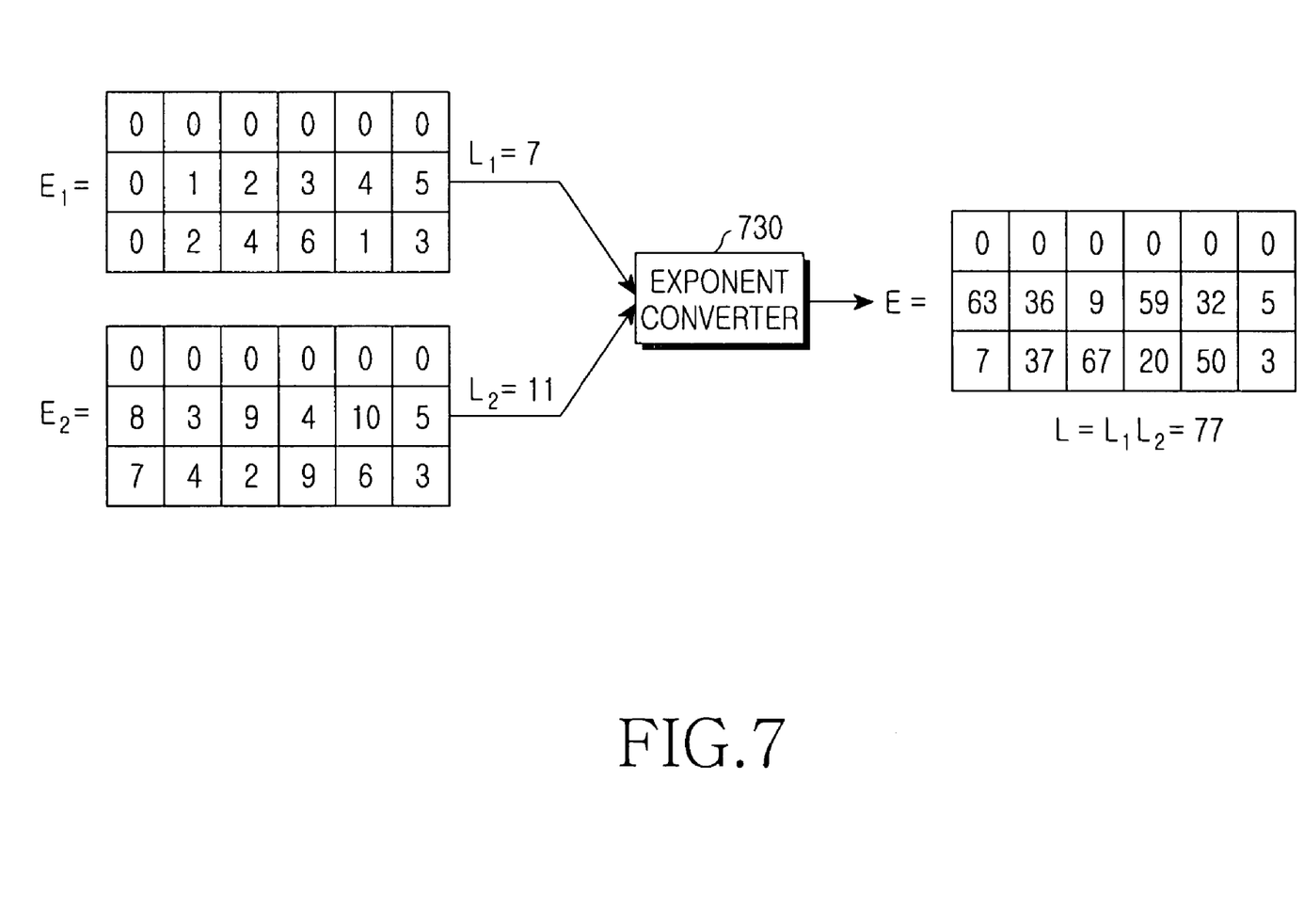
FIG. 7 is a block diagram showing an example of generating QC-LDPC codes according to the present invention.

FIG. 7 shows an example of applying the regular QC-LDPC codes according to the present invention. In this case, the exponent matrixes of the QC-LDPC codes $C_1$ and $C_2$ are respectively defined as $E_1$ and $E_2$, and the sizes $L_1$ and $L_2$ of the permutation matrixes of the parity check matrixes of the $C_1$ and $C_2$ are assumed to have their respective values $L_1=7$, $L_2=11$. Based on the exponent matrixes $E_1$ and $E_2$, the exponent converter 730 generates the exponent value $a_{mn}$ of the new parity check matrix H using Formula 9. The exponent value newly generated is used to generate a new exponent matrix E with a block size of $L=77$ of the new parity check matrix. In this case, assuming that the total M QC-LDPC codes are stored by using the Chinese Remainder Theorem, the exponent converter 730 gives the same effect as the total $2^M - 1$ QC-LDPC codes have been stored. This reduces the required amount of memory at a rate of $M/(2^M-1)$. Also, the newly generated QC-LDPC codes do not suffer significant degradation of performance because of the improved cycle characteristics in the Tanner graph compared with the originally stored codes. It is readily appreciated that the invention may be applied to all the QC-LDPC codes based on the cyclic permutation matrix.

As described above, all kinds of LDPC codes may be decoded using the sum-product algorithm in the factor graph. The decoding method is generally divided into a bidirectional transfer process and a flow transfer process. The bidirectional transfer process requires a node processor per check node for decoding, so that the complexity of the decoder is increased with the number of the check nodes, but the decoding speed is greatly increased because of the entire nodes being simultaneously updated. On the contrary, the flow transfer process employs a single node processor for updating information through the whole nodes in the factor graph, so that the structure of the decoder is very simplified, but the decoding speed is varied reversely with the size of the parity check matrix, namely, the number of the nodes.

However, when composing the parity check matrix by the block unit as the block LDPC codes with various coding rates according to the invention, the node processors are only required with the number of the blocks for decoding, so that the decoder has a much less complexity than the bidirectional transfer processor, and a much faster decoding speed than the flow transfer process.

Figure 8:
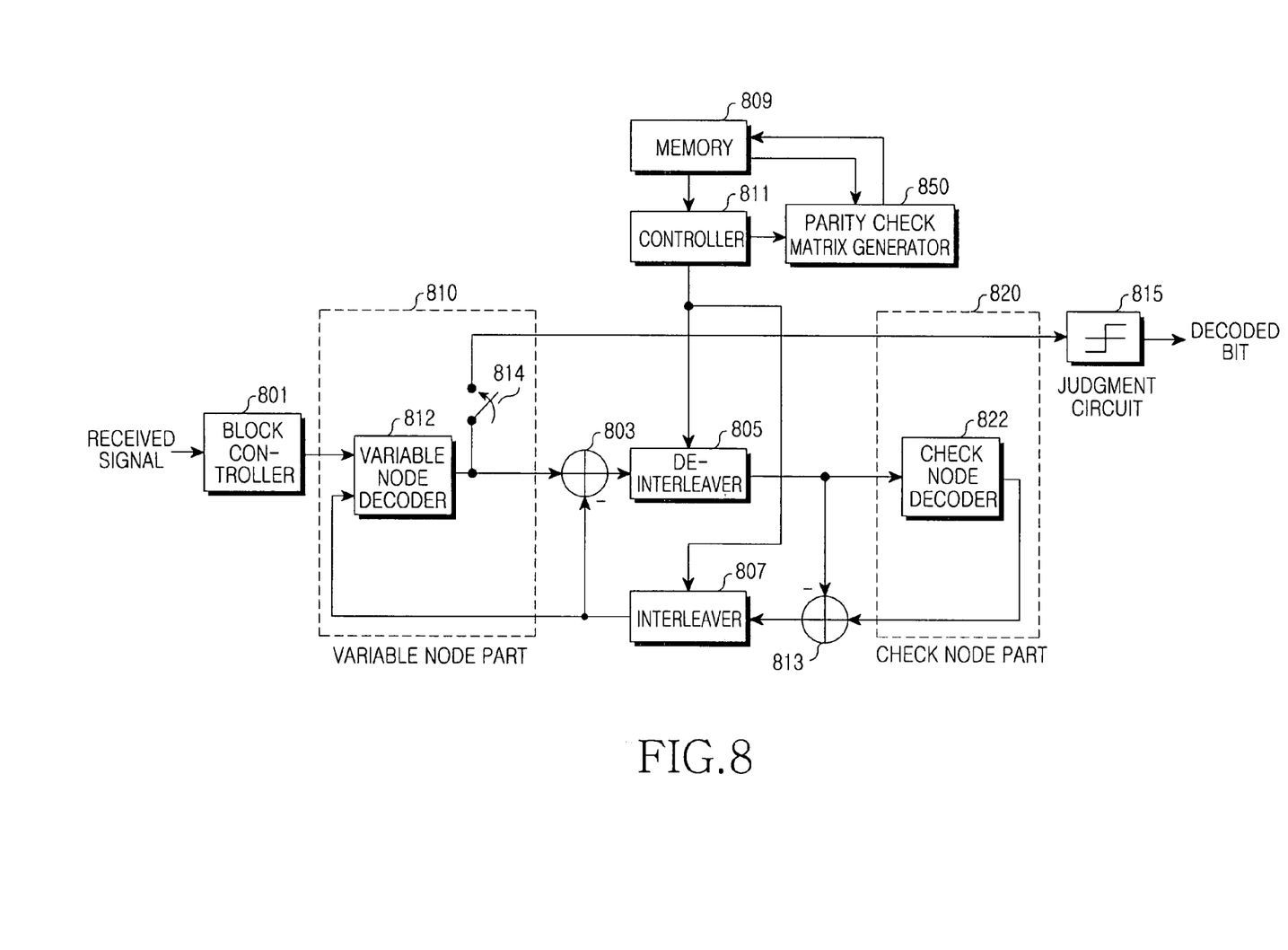
FIG. 8 is a block diagram illustrating the decoding of regular QC-LDPC codes according to the present invention.

FIG. 8 is a block diagram for illustrating the structure of a decoder for decoding the LDPC codes with various coding rates according to the present invention.

Referring FIG. 8, the decoder for decoding the LDPC codes with various coding rates comprises a block controller 801, variable node part 810, adder 803, de-interleaver 805, interleaver 807, memory 809, controller 811, parity check matrix generator 850, adder 813, check node part 820, and judgment circuit 815. The variable node part 810 comprises a variable node decoder 812 and switch 814. The check node part 820 comprises a check node decoder 822.

The block controller 801 determines the block size of the signals received via a radio channel. The output signals of the block controller 801 are delivered to the variable node decoder 812, which calculates and updates the probabilities of the output signals delivered to the switch 814 and the adder 803. The adder 803 subtracts the output signal of the interleaver 807 in the previous decoding iteration from the output signal of the variable node decoder 812 to deliver the differential signal to the de-interleaver 805. In this case, if the decoding is initially made without any previous decoding, the output signal of the interleaver 807 is regarded naturally as "0."

The de-interleaver 805 de-interleaves the output signal of the adder 803 according to a predetermined rule to output a signal delivered to the adder 813 and the check node decoder 822. The adder 813 subtracts the output signal of the de-interleaver 805 from the output signal of the check node decoder 822 in the previous decoding iteration to deliver the differential signal to the interleaver 807. The interleaver 807 interleaves the output signal of the adder 813 according to a predetermined rule under the control of the controller 811 to output a signal delivered to the adder 803 and the variable node decoder 812. The controller 811 controls the interleaving of the interleaver 807 according to the interleaving information stored in the memory 809.

The parity check matrix generator 850 calculates the parity check matrix for the block size presently used by the controller 811 based on the parity check matrix stored in the memory 809. In this case, the method mentioned above is used to generate a new parity check matrix. Namely, the exponent converter 630 as shown in FIG. 6 is used to calculate a new parity check matrix corresponding to the parity check matrix stored in the memory 809. The new parity check matrix is again stored in the memory 809, so that it may be used by the interleaver 807 and de-interleaver 805 under the control of the controller. In this case, the new parity check matrix is wholly stored in the memory 809, or otherwise only its exponent matrix. Of course, if decoding is initially made, the output signal of the de-interleaver must be regarded as "0."

After completing the decoding iteration by repeating a predetermined number of decoding steps, the switch 814 switches off the connection between the variable node decoder 812 and the adder 803, and instead switches on the connection between the variable node decoder 812 and the judgment circuit 815, so that the output signal of the variable node decoder 812 may be delivered to the judgment circuit 815 to generate the decoded value finally determined.

As described above, the inventive method uses LDPC codes without a short cycle to achieve error-free data transmission. The QC-LDPC code is advantageous in correctly recovering the received data. Also the inventive method designs the QC-LDPC code with a minimum cycle equal to or greater than that of the component codes by applying the Chinese Remainder Theorem. Further, the memory efficiency is greatly improved because a small number of QC-LDPC codes are used by applying the Chinese Remainder Theorem to generate many new QC-LDPC codes.

While the invention has been shown and described with reference to a certain preferred embodiment thereof, it will be understood by those skilled in the art that various changes in form and details may be made therein without departing from the spirit and scope of the invention.

What is claimed is:

1. A method of generating LDPC (Low Density Parity Check) codes in a communication system using an error-correcting code, comprising the steps of:

performing exponent conversion of a predetermined number of exponent matrixes stored in advance so as to generate new exponent matrixes based on said exponent conversion; and generating new LDPC codes using said new exponent matrixes, wherein said exponent conversion comprises:

calculating the size of permutation matrixes constituting a given number of parity check matrixes;

calculating exponent value of a parity check matrix for each of a given number of exponent matrixes; and performing exponent conversion of the size of said permutation matrixes and said exponent value.

2. A method as defined in claim 1, further comprising setting a generated parity check matrix to infinity ($\infty$) if the exponent value of the parity check matrix is infinity ($\infty$).

3. A method as defined in claim 1, further comprising:

calculating the size of the permutation matrixes constituting the parity check matrix if the exponent value of the parity check matrix is not infinity ($\infty$); and calculating the exponent value of a generated parity check matrix based on the calculated size of the permutation matrixes.

4. A method as defined in claim 3, wherein the size of the permutation matrixes is calculated by:

$$L = L_1 L_2 \ldots L_S$$

where L represents the size of the permutation matrixes obtained by multiplying all the sizes of the permutation matrixes numbered from 1 to s.

5. A method as defined in claim 3, wherein the exponent value of the parity check matrix is calculated by:

$$a_{nm} = \sum_{k=1}^{s} a_{mn}^k b_k L'_k \mod L$$

where L represents the block size of the newly generated parity check matrix, $b_k$ is an arbitrary constant, and $L_k$ is the value obtained by dividing L generated by multiplying all $L_k$ elements from 1 to s by $L_k$.

6. A method as defined in claim 5, wherein $b_k$ is a value guaranteeing that the girth of the newly generated parity check matrix is equal to or greater than that of the original parity check matrix.

7. A method as defined in claim 3, wherein said exponent matrix is calculated for all m rows and n columns as expressed by:

$$E(H)Z-(a_{mn})$$

where E(H) represents the exponent matrix, and $a_{mn}$ the exponent value of the parity check matrix.

8. A method as defined in claim 1, further comprising storing the new parity check matrix.

9. A method as defined in claim 1, further comprising performing de-interleaving and interleaving adapted for the new parity check matrix according to a system setting so as to decode quasi-cyclic LDPC codes (QC-LDPC codes) by performing iteration decoding of the interleaved signal.

10. A method of generating a QC-LDPC code in a communication system using an error-correcting code, comprising the steps of:

calculating the size of permutation matrixes constituting a generated parity check matrix corresponding to an exponent value of a given parity check matrix;

calculating the exponent value of the parity check matrix based on the size calculated of the permutation matrixes;

calculating an exponent matrix based on the exponent value; and exponent-coupling said exponent matrix and the permutation matrixes so as to generate the parity check matrix.

11. A method as defined in claim 10, further comprising:

checking the exponent value of a given parity check matrix; and selling the generated parity check matrix to infinity (∞), or calculating the size of the permutation matrixes constituting the parity check matrix so as to obtain the exponent value of the generated parity check matrix when the exponent value of said given parity check matrix is infinity (∞) or no.

12. A method as defined in claim 10, wherein the size of the permutation matrixes is calculated by:

$$L=L_1 L_2 \ldots L_S$$

where L represents the size of the permutation matrixes obtained by multiplying all the sizes of the permutation matrixes numbered from 1 to s.

13. A method as defined in claim 10, wherein the exponent value of the parity check matrix is calculated by:

$$a_{nm} = \sum_{k=1}^{s} a_{mn}^k b_k L'_k \mod L$$

where L represents a block size of a newly generated parity check matrix, $b_k$ is an arbitrary constant, and $L'_k$ is the value obtained by dividing L generated by multiplying all $L_k$ elements from 1 to s by $L_k$.

14. A method as defined in claim 13, wherein is $b_k$ is a value guaranteeing that a girth of the newly generated parity check matrix is equal to or greater than that of an original parity check matrix.

15. A method as defined in claim 10, wherein said exponent matrix is calculated for all m rows and n columns as expressed by:

$$E(H)-(a_{mn})$$

where E(H) represents the exponent matrix, and $a_{mn}$ the exponent value of the parity check matrix.

16. A method as defined in claim 10, further comprising storing only the exponent matrix corresponding to the parity check matrix obtained by exponent-coupling said exponent matrix and the permutation matrixes in a given memory.

17. A method as defined in claim 10, further comprising the further step of storing the entire parity check matrix obtained by exponent-coupling said exponent matrix and the permutation matrixes in a given memory.

18. A method as defined in claim 10, further comprising of performing de-interleaving and interleaving adapted for a new parity check matrix according to a system setting so as to decode an QC-LDPC code by performing iteration decoding of the interleaved signal.

19. An apparatus for generating QC-LDPC codes in a communication system using an error-correcting code, comprising:

a first memory for storing exponent matrixes of QC-LDPC codes;

an exponent converter for performing exponent conversion of a given number of exponent matrixes stored in the first memory so as to generate exponent values of generated parity check matrixes;

a second memory for storing new exponent matrixes based on the exponent values outputted from said exponent converter; and a QC-LDPC code generator for generating new QC-LDPC codes based on the exponent matrixes stored in the second memory.

20. An apparatus as defined in claim 19, wherein said exponent converter calculates the size of permutation matrixes constituting the generated parity check matrix corresponding to the exponent value of a given parity check matrix so as to generate the exponent matrix based on the exponent value.

21. An apparatus as defined in claim 19, wherein said QC-LDPC code generator generates the parity check matrix by exponent-coupling said exponent matrix and permutation matrixes.

22. An apparatus as defined in claim 19, wherein said exponent converter sets the generated parity check matrix to infinity (∞), or calculates the size of permutation matrixes constituting the parity check matrix so as to obtain the exponent value of the generated parity check matrix when the exponent value of said given parity check matrix is infinity (∞) or no.

23. An apparatus as defined in claim 22, wherein the size of the permutation matrixes is calculated by:

$$L = L_1 L_2 \ldots L_S$$

where L represents the size of the permutation matrixes obtained by multiplying all the sizes of the permutation matrixes numbered from 1 to s.

24. An apparatus as defined in claim 19, wherein the exponent value of the parity check matrix is calculated by:

$$a_{nm} = \sum_{k=1}^{s} a_{mn}^k b_k L'_k \bmod L$$

where L represents a block size of a newly generated parity check matrix, $b_k$ is an arbitrary constant, and $L'_k$ is the value obtained by dividing L generated by multiplying all $L_k$ elements from 1 to s by $L_k$.

25. An apparatus as defined in claim 24, wherein $b_k$ is a value guaranteeing that a girth of the newly generated parity check matrix is equal to or greater than that of an original parity check matrix.

26. An apparatus as defined in claim 19, wherein said exponent matrix is calculated for all m rows and n columns as expressed by:

$$E(H) = (a_{mn})$$

where E(H) represents the exponent matrix, and $a_{mn}$ the exponent value of the parity check matrix.

27. An apparatus as defined in claim 19, wherein the second memory stores only the exponent matrix corresponding to the parity check matrix, or the entire parity check matrix.

28. An apparatus for generating QC-LDPC codes in a communication system using an error-correcting code, comprising:
- a variable node decoder for detecting probabilities of received signals by connecting variable matrix;
- a de-interleaver for dc-interleaving an output signal of said variable node decoder so as to correspond with said determined parity check matrix;
- a check node decoder for detecting probabilities of the output signals of said de-interleaver by connecting check nodes corresponding to a weight of each of the rows constituting said determined parity check matrix;
- an interleaver for interleaving an output signal of said check node decoder so as to correspond with said determined parity check matrix, the output signal of said interleaver being delivered to said variable node decoder;
- a controller for controlling said dc-interleaving and interleaving so as to correspond with said determined parity check matrix; and
- a parity check matrix generator for generating the parity check matrix of a presently used block size based on the parity check matrix stored in a memory,
- wherein said parity check matrix generator generates a new parity check matrix corresponding to the parity check matrix stored in the memory through exponent conversion, and provides said interleaver and de-interleaver with said newly stored parity check matrix.

29. An apparatus as defined in claim 28, further comprising a block controller for determining whether to use a given parity check matrix so as to correspond with the size of a decoded block QC-LDPC code.

30. An apparatus as defined in claim 28, further comprising a first adder for subtracting a signal produced in a previous decoding from the output signal of said variable node decoder.

31. An apparatus as defined in claim 28, further comprising a second adder for subtracting the output signal of said de-interleaver from the output signal of said check node decoder.

32. An apparatus as defined in claim 28, wherein said parity check matrix generator includes an exponent converter for performing exponent conversion of exponent matrixes stored in the memory so as to calculate the exponent value of the parity check matrix generated.

33. An apparatus as defined in claim 32, wherein said exponent converter calculates a size of permutation matrixes constituting the parity check matrix generated so as to correspond with the exponent value of a given parity check matrix, and generates the exponent matrix from the exponent value of said parity check matrix obtained using the calculated size.

34. An apparatus as defined in claim 32, wherein said exponent converter sets the generated parity check matrix to infinity (∞), or calculates a size of permutation matrixes constituting the parity check matrix so as to obtain the exponent value of the generated parity check matrix when the exponent value of said given parity check matrix is infinity (∞) or no.

35. An apparatus as defined in claim 34, wherein the size of the permutation matrixes is calculated by:

$$L = L_1 L_2 \ldots L_S$$

where L represents the size of the permutation matrixes obtained by multiplying all the sizes of the permutation matrixes numbered from 1 to s.

36. An apparatus as defined in claim 32, wherein the exponent value of the parity check matrix is calculated by:

$$a_{nm} = \sum_{k=1}^{s} a_{mn}^k b_k L'_k \bmod L$$

where L represents the block size of the newly generated parity check matrix, $b_k$ is an arbitrary constant, and $L_k$ is the value obtained by dividing L generated by multiplying all $L_k$ elements from 1 to s by $L_k$.

37. An apparatus as defined in claim 36, wherein is $b_k$ a value guaranteeing that a girth of a newly generated parity check matrix is equal to or greater than that of an original parity cheek matrix.

38. An apparatus as defined in claim 32, wherein said exponent matrix is calculated for all m rows and n columns as expressed by:

$$E(H)(a_{mn})$$

where E(H) represents the exponent matrix, and $a_{mn}$ the exponent value of the parity check matrix.

39. An apparatus as defined in claim 28, wherein said parity check matrix generator includes a QC-LDPC code generator for generating the parity check matrix by exponent-coupling said exponent matrix and permutation matrixes.

* * * * *